United States Patent [19]
Palara

[11] Patent Number: 5,570,057
[45] Date of Patent: Oct. 29, 1996

[54] THREE-TERMINAL INSULATED-GATE POWER ELECTRONIC DEVICE WITH A VARIABLE-SLOPE SATURATED OUTPUT CHARACTERISITIC DEPENDING IN A DISCONTINUOUS WAY ON THE OUTPUT CURRENT

[75] Inventor: Sergio Palara, Acicastello, Italy

[73] Assignee: SGS-Thomson Microelectronics S.r.l., Agrate Brianza, Italy

[21] Appl. No.: 420,756

[22] Filed: Apr. 12, 1995

[30]   Foreign Application Priority Data

Apr. 12, 1994  [EP]   European Pat. Off. .............. 94830168

[51] Int. Cl.⁶ .................................................. H03K 17/00
[52] U.S. Cl. .......................... 327/365; 327/108; 327/403; 327/427; 327/478
[58] Field of Search .................................. 327/108, 431, 327/110, 432, 403, 433, 404, 434, 405, 478, 419, 483, 427, 365

[56]        References Cited

U.S. PATENT DOCUMENTS

| | | | |
|---|---|---|---|
| 4,189,651 | 2/1980 | Akamatsu | 307/254 |
| 4,366,522 | 12/1982 | Baker | 361/91 |
| 4,404,478 | 9/1983 | Rischmüller | 307/315 |
| 4,672,245 | 6/1987 | Majumdar et al. | 327/432 |
| 4,680,483 | 7/1987 | Giodano | 307/355 |
| 5,061,863 | 10/1991 | Mori et al. | 327/478 |
| 5,170,072 | 12/1992 | Ihara | 326/82 |

FOREIGN PATENT DOCUMENTS

| | | | |
|---|---|---|---|
| 0029767 | 6/1981 | European Pat. Off. | H03K 17/06 |
| 2373181 | 6/1978 | France | H02H 9/04 |
| 2471702 | 6/1981 | France | H03K 17/08 |

OTHER PUBLICATIONS

European Search Report from European Patent Application Number 94830168.4.

*Primary Examiner*—Timothy P. Callahan
*Assistant Examiner*—Jeffrey Zweizig
*Attorney, Agent, or Firm*—David M. Driscoll; James H. Morris; Richard F. Giunta

[57]          ABSTRACT

A three-terminal insulated-gate power electronic device includes a first, bipolar power transistor and a second, insulated-gate transistor forming a darlington pair. The bipolar power transistor has a first electrode, a second electrode, and a control electrode respectively connected to a first electrode of the insulated-gate transistor and to a first external terminal of the three-terminal device, to a second external terminal of the three-terminal device, and to one second electrode of the insulated-gate transistor. The three-terminal device further includes switching means connected between the control electrode and the second electrode of the bipolar power transistor, and control circuit means connected to another second electrode of the insulated-gate transistor and controlling the switching means to switch it from a highly-conducting condition for low values of a current flowing through the first and second external terminals to a non-conducting condition for high values of the current flowing between the first and second external terminals.

56 Claims, 3 Drawing Sheets

5,570,057

THREE-TERMINAL INSULATED-GATE POWER ELECTRONIC DEVICE WITH A VARIABLE-SLOPE SATURATED OUTPUT CHARACTERISITIC DEPENDING IN A DISCONTINUOUS WAY ON THE OUTPUT CURRENT

BACKGROUND OF THE INVENTION

1. Field of the Invention

The present invention relates to a three-terminal insulated-gate power electronic device with a variable-slope saturated output characteristic depending in a discontinuous way on the output current.

2. Discussion of the Related Art

Modern Lamp ballast circuits make use of Power MOS transistors, which combine fast switching performance with ease of driving. In such circuits, the required value for the Power MOS transistor "on" resistance (Ron) in saturation condition is about 1.2 ohm. Since in steady-state operating conditions the current flowing through the Power MOS transistor is in the range of 200–400 mA, the power dissipated by the Power MOS transistor is not of concern. The problem arises during the circuit start-up, when currents of the order of 5 A are necessary. During startup, the power dissipation in the Power MOS transistor becomes significant, as the voltage drop across the power MOS transistor can reach 6 V.

This problem is related to the linearity of the output current-voltage characteristic of the Power MOS transistor, wherein the output resistance is substantially constant and independent of the output current.

Another well-known power electronic device includes a MOSFET designed for high voltages (e.g. 650 V) and a bipolar power transistor connected in a darlington configuration, with the MOSFET drain and source electrodes connected respectively to the bipolar transistor collector and base electrodes. This device, called an "Insulated Gate Darlington" (IGD), exhibits a saturation output resistance which, for high collector currents, is much lower than that of a MOS field effect transistor, so that even when currents of some Amperes flow, the power dissipation and the voltage drop across the power device are kept low. For low collector currents, however, the output resistance of the IGD is higher than that of a MOS field effect transistor, resulting in excessive power dissipation during the steady state operation.

A possible solution to the problem of excessive power dissipation during steady state operation in the IGD includes the connection of a low value resistor (e.g. 1 ohm) in parallel with the base-emitter junction of the power bipolar transistor. In this manner, the saturated output characteristic of the overall device is MOSFET-type for low output currents and bipolar-type for high output currents. The output resistance in the MOSFET-type region of the output characteristic is given by the sum of the MOSFET on-resistance plus 1 ohm. If the ballast circuit is designed for working with a resistance value of 1–2 ohm, the MOSFET on-resistance must be 0.2 ohm. Such a low value is not common or practical to achieve in high-voltage MOSFETS. On the other hand, the resistance value of the base-emitter resistor cannot be significantly reduced, since this would result in an excessively high current flowing through the MOSFET when the power bipolar transistor is on (such current is in fact given by $V_{BE}/R$, where $V_{BE}$ is the voltage across the base-emitter junction of the power bipolar transistor in saturation, typically 650 mV, and R is the resistance value of the base-emitter resistor). A high current flowing through the MOSFET is again responsible for a high voltage drop across it, and therefore is responsible for an excessive power dissipation.

In view of the state of the prior art described, an object of the present invention is to provide a three-terminal power electronic device which does not causes excessive power dissipation either for low output currents or for high output currents. The three-terminal device may be suitable for use in ballast circuits without being affected by the above mentioned drawbacks.

SUMMARY OF THE INVENTION

The foregoing object is attained in one illustrative embodiment of the invention wherein a three-terminal insulated-gate power electronic device is provided comprising a bipolar power transistor and an insulated-gate transistor forming a darlington pair. The bipolar power transistor has a first electrode, a second electrode and a control electrode respectively connected to a first electrode of the insulated-gate transistor and a first external terminal of the three-terminal device, to a second external terminal of the three-terminal device, and to a second electrode of the insulated-gate transistor. The three-terminal insulated-gate power transistor further includes switching means connected between the control electrode and the second electrode of the bipolar power transistor, and control circuit means connected to another second electrode of the insulated-gate transistor and controlling said switching means to switch them from a highly-conducting condition for low values of a current flowing through the first and second external terminals to a non-conducting condition for high values of the current flowing through the first and second external terminals.

The present invention makes it possible to realize a three-terminal power electronic device with an output resistance which, for low currents is dominated by the on-resistance of the insulated-gate transistor, while for high currents is dominated by the output resistance of the bipolar power device.

BRIEF DESCRIPTION OF THE DRAWINGS

These and other features and advantages of the present invention will become apparent by the following detailed description of two embodiments, illustrated as non-limiting examples in the annexed drawings, in which.

DETAILED DESCRIPTION

Figure 1:
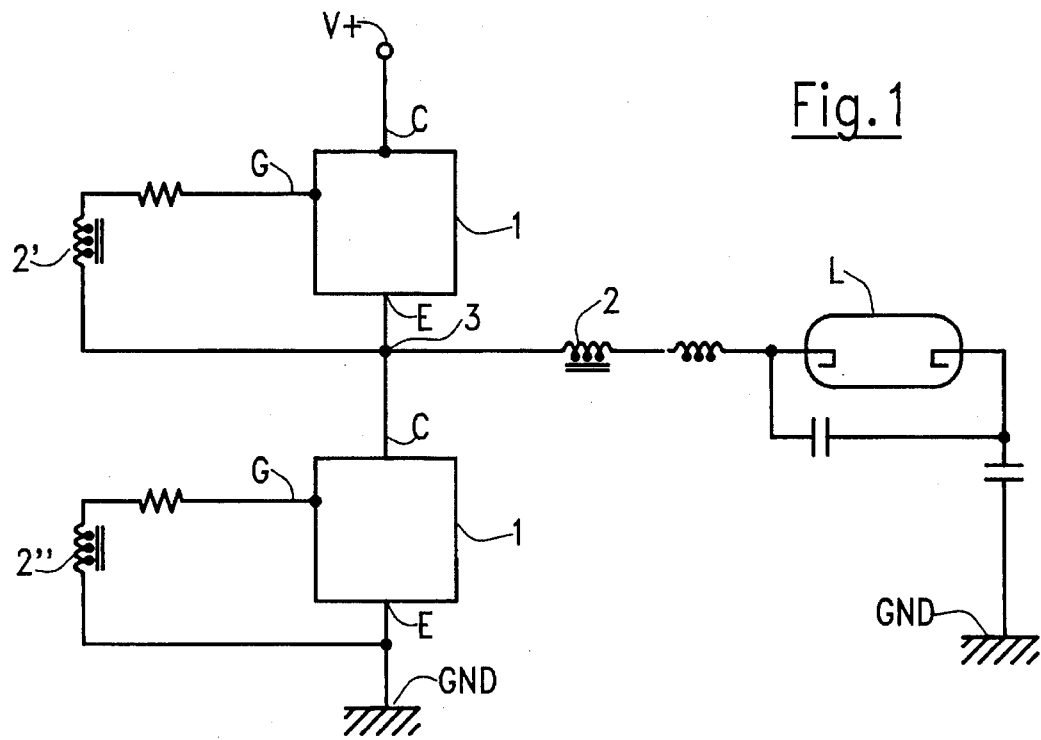
FIG. 1 is a schematic circuit diagram of a lamp ballast circuit making use of two three-terminal devices according to the present invention.

FIG. 1 illustrates a ballast circuit for driving a lamp L. The ballast circuit includes two three-terminal power electronic devices 1, each having two power terminals C and E and a driving terminal G. A first one of the two three-terminal devices 1 has one power terminal C connected to a power supply line V+, and another power terminal E connected to one end 3 of a primary winding 2 of a transformer, that is connected in series with the lamp L. The second three-terminal device 1 has one power terminal C also connected to the end 3 of the primary winding 2, and another power terminal E connected to a ground line GND. The first three-terminal device 1 has the driving terminal G connected, through a first secondary winding 2' of the transformer, to the end 3 of the primary winding 2, while the second three-terminal device 1 has a driving terminal G connected, through a second secondary winding 2", to the ground line GND. The ballast circuit is also provided with a starter circuit (not shown). The circuit thus obtained is self-oscillating, i.e., once the power supply line V+ has been powered, a sinusoidal current starts flowing through the lamp L, and the three-terminal devices 1 alternatively connect the end 3 of the primary winding 2 of the transformer to the power supply Line V+ and to the ground Line GND.

Figure 2:
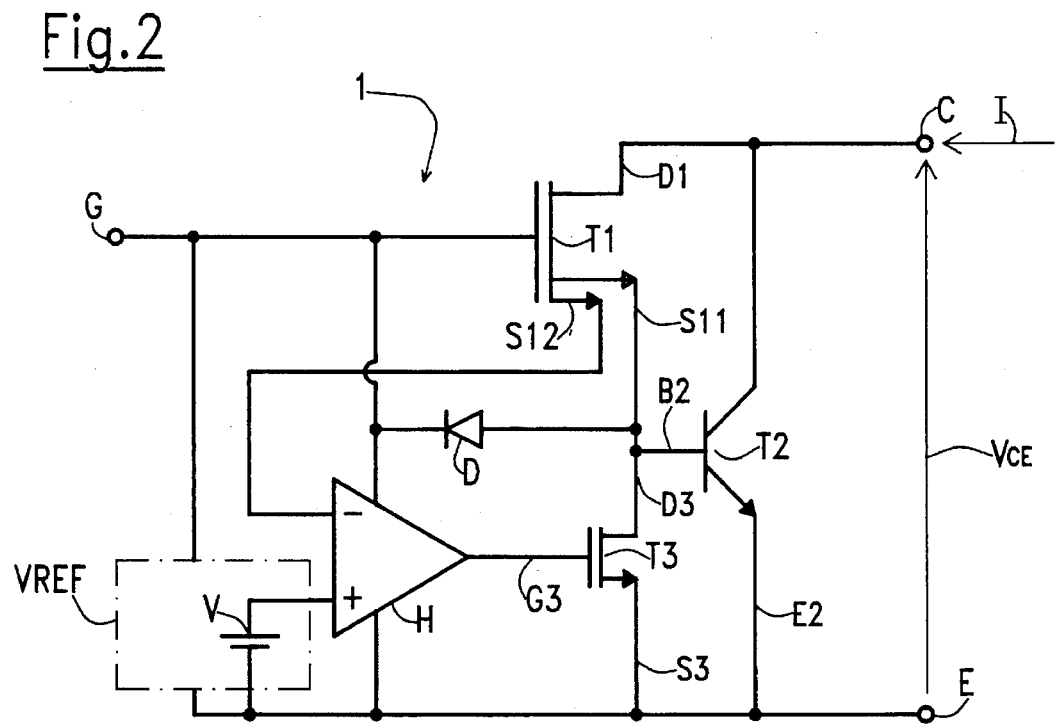
FIG. 2 is a circuit diagram of a first embodiment of a three-terminal device according to the present invention.
Figure 5A:
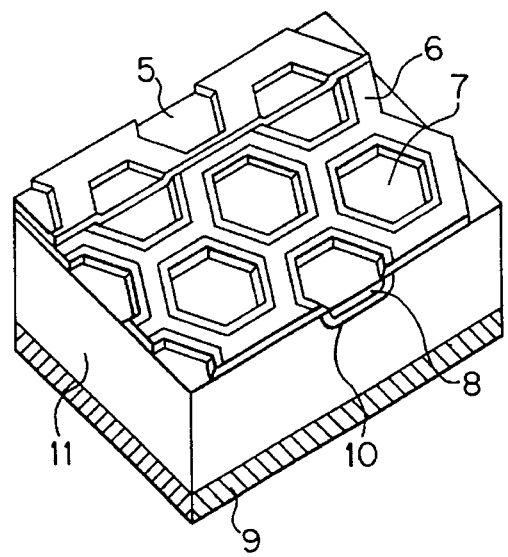
FIG. 5A is a structural diagram of an illustrative power MOSFET, having multiple source cells, for use in the device of the present invention.
Figure 5B:
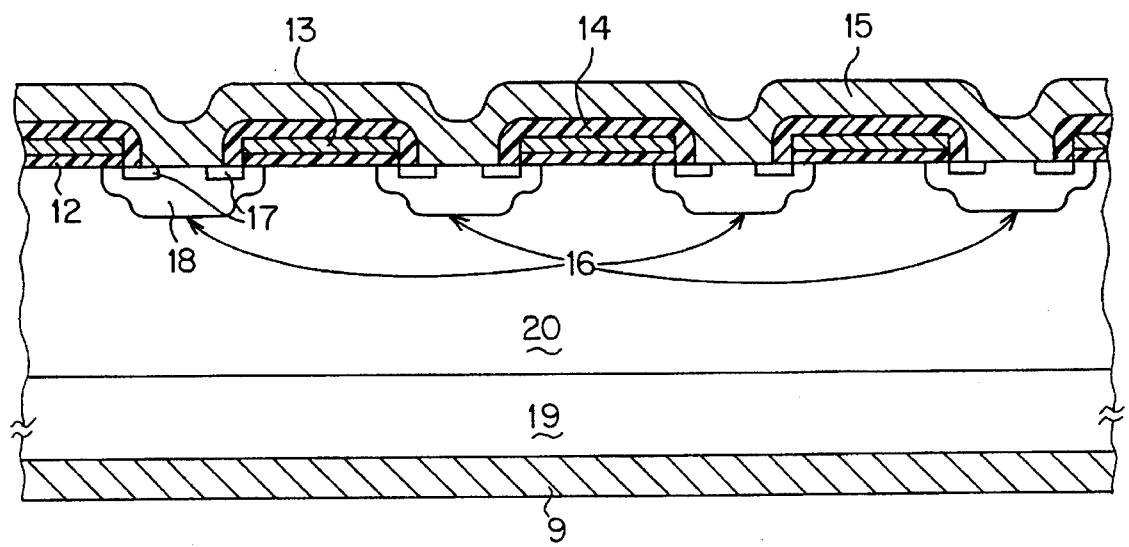
FIG. 5B is a cross-sectional diagram of a portion of an illustrative power MOSFET with multiple source cells for use in the device of the present invention.

As shown in FIG. 2, a three-terminal electronic device 1 according to the present invention comprises a high-voltage MOS field effect transistor T1, a low-voltage MOS field effect transistor T3, and a bipolar power transistor T2. The high-voltage MOS transistor T1 is composed, in a conventional manner, by a plurality of identical elementary source cells, and has a drain electrode D1 connected to a collector electrode C2 of The bipolar power transistor T2 and to an external collector terminal C. FIGS. 5A and 5B illustrate exemplary arrangements of multiple source cells for forming a high-voltage MOS transistor. The structure of FIG. 5A includes an N type substrate 11 in contact with a drain metallization 9, and a plurality of source cells 7 interconnected by a metallization 5. Each of the source cells 7 has an N+ source region 8 in contact with a P type region 10 and a silicon gate 6. FIG. 5B is a cross-sectional view of a portion of another illustrative power MOSFET having a plurality of source cells. The structure of FIG. 5B includes an N+ substrate 19 in contact with a N– drain layer 20 and a drain metallization 9. A gate oxide layer 12 is formed over the N– drain layer 20 and in contact with a polysilicon gate layer 13, and a dielectric layer 14 is formed on top of the polysilicon gate layer 13. The structure further includes a plurality of source cells 16 each having a body region 18 and two source regions 17. The plurality of source cells 16 is interconnected by source metallization 15. Each of the plurality of source cells in a high-voltage MOSFET as shown in FIGS. 5A and 5B contributes a fraction of the total current of the device. The high-voltage MOSFET of FIG. 2, which has multiple source electrodes, includes a first plurality of source cells (e.g., 7 in FIG. 5A and 16 in FIG. 5B) connected to a first source electrode, and a second plurality of source cells connected to a second source electrode. The high-voltage MOS transistor T1 has a first source electrode S11, to which a first subset of said plurality of elementary source cells is connected, which is connected to a base electrode B2 of the bipolar power transistor T2 and to a drain electrode D3 of the low-voltage MOS transistor T3. A source electrode S3 of the low-voltage MOS transistor T3 and an emitter electrode E2 of the bipolar power transistor T2 are commonly connected to an external emitter terminal E. The high-voltage MOS transistor T1 has a second source electrode S12, to which a second subset of the plurality of elementary source cells is connected. The second source electrode S12 is connected to a first, inverting input of a comparator H, whose second, non-inverting input is connected to a reference voltage supply VREF. The output of the comparator H is connected to a gate electrode G3 of the low-voltage MOS transistor T3.

A gate electrode of the high-voltage MOS transistor T1 is connected to an external gate terminal G. A diode D is back-connected between the external gate terminal G and the base electrode B2 of the bipolar power transistor T2.

When the three-terminal device 1 is used in the ballast circuit of FIG. 1 and the voltage applied to the external gate terminal G is positive and sufficient to drive T1 into saturation (e.g., 10 V), T1 and T3 are both on, and they sink a current I from the external collector terminal C. Since T3 is a low-voltage MOS transistor, its on resistance is negligible with respect to that of T1, which is a high-voltage MOS transistor. For this reason, the voltage drop across T3 is negligible, and the voltage drop across T1, i.e., the voltage between its drain electrode D1 and its first source electrode S11, is almost equal to the voltage $V_{CE}$ applied across the external collector and emitter terminals C and E. Since no significant current is drained by the inputs of comparator H, the voltage on the second source electrode S12 of T1 is almost equal to the voltage on the drain electrode D1; the voltage on the second source electrode S12 of T1 substantially follows the voltage on the external collector terminal C. The current I starts flowing in a sinusoidal way. In this phase the output resistance of the three-terminal device 1 is dominated by the on-resistance of the MOS transistor T1.

When the voltage drop across T1 and T3, i.e., $V_{CE}$, exceeds the value V of the reference voltage generated by VREF, the comparator H switches and turns T3 off, so that the voltage on the first source electrode S11 of T1 is pulled toward the voltage on the collector terminal C, if the reference voltage supply VREF is designed to generate a reference voltage V equal or greater to the turn-on base-emitter voltage $V_{BEON}$ of T2 (typically 650 mV), T1 can drive the base electrode B2 of T2 to turn it on. From now on, the three-terminal device works as an IGD, and its operating point trips into a low-resistance region, dominated by the output resistance of T2.

When the current I flowing into the collector terminal C of the three-terminal device starts decreasing, so does the voltage $V_{CE}$. When $V_{CE}$ falls below the voltage value V, the comparator H switches and turns T3 on, which, in turn, by virtue of its much lower on-resistance than that of T1, pulls the base voltage of T2 toward the voltage on the emitter terminal E and thus turns T2 off. The output characteristic of the three-terminal device is again dominated by the on-resistance of T1.

The presence of the diode D increases the switching speed of the three-terminal device, as it helps to turn T2 off when the voltage applied to the gate terminal G with respect to the emitter terminal E goes negative.

Figure 3:
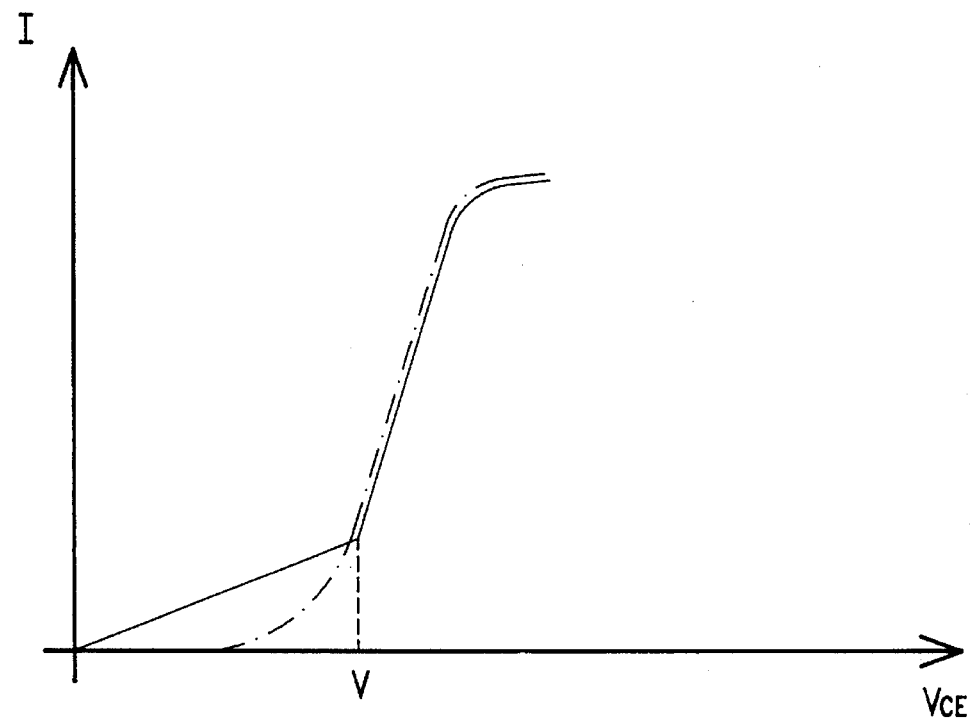
FIG. 3 shows an output current-voltage characteristic curve for the device of FIG. 2.

The output current-voltage characteristic of the three-terminal device of FIG. 2 is shown in FIG. 3. It is possible to see that for $V_{CE}$ values below the reference voltage V, i.e., for low currents, the three-terminal device shows an output resistance higher than that shown for $V_{CE}$ values above V, i.e., for high currents. Such resistance is however lower than that shown by a common IGD (shown in dash-and-dot line in FIG. 3). As compared to the above-described IGD with base-emitter resistor device according to the prior art, the three-terminal device according to the present invention exhibits a much lower voltage drop across it for low currents. Furthermore, the bipolar power transistor T2 is better driven, since after T3 has been turned off, the whole drain current of T1 flows into the base of T2, instead of being divided between the base of the bipolar power transistor and the base-emitter resistor.

Figure 4:
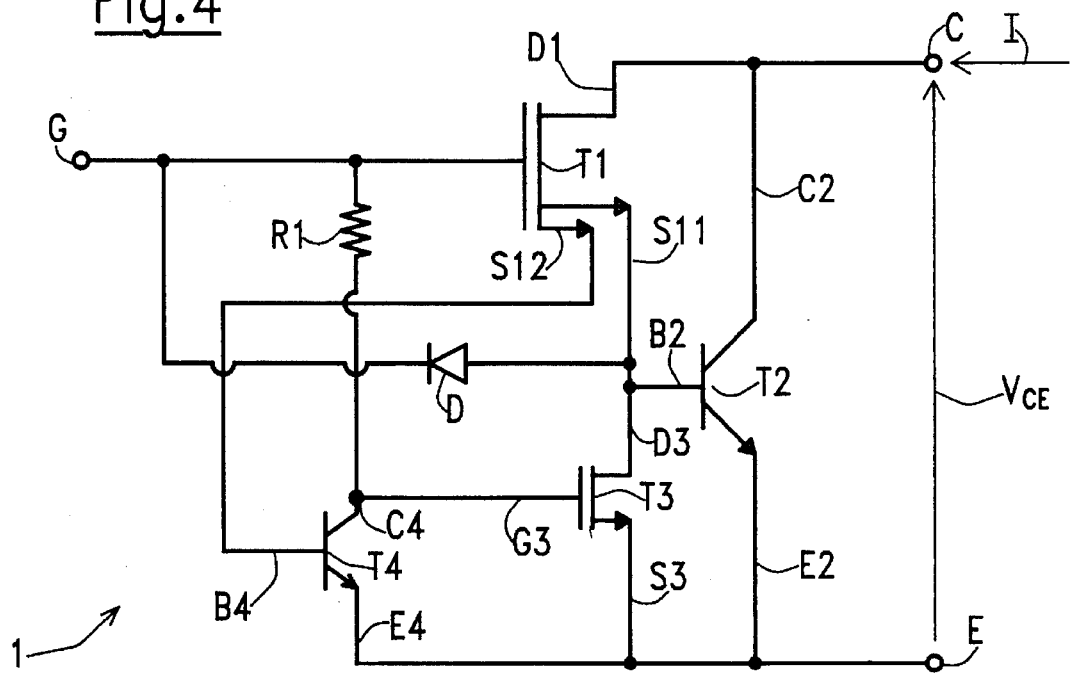
FIG. 4 is a circuit diagram of a second embodiment of the three-terminal device according to the present invention.

FIG. 4 shows another embodiment of a three-terminal device according to the invention. The comparator H and the voltage reference VREF have been replaced by an NPN bipolar transistor T4 having a base electrode B4 connected to the second source electrode S12 of T1, and an emitter electrode E4 connected to the external emitter electrode E. A collector electrode C4 of T4 is connected to the gate electrode G3 of T3 and, through a bias resistor R1, to the external gate terminal G. In this embodiment, when a positive voltage is applied to the external gate terminal G of the device, and when the voltage applied to the external collector terminal C exceeds the base-emitter turn-on voltage $V_{BEON}$ of the transistor B4 (approximately 650 mV), T4 turns on and turns T3 off. In fact, as long as the voltage $V_{CE}$ is lower than $V_{BEON}$, no current is supplied by the second source electrode S12 of T1, and the voltage on S12 is equal to the voltage on C. When the voltage $V_{CE}$ equals $V_{BEON}$, T4 is turned on. As in the previous embodiment, T1 can now drive the base electrode B2 of T2 to turn it on, and the operating point trips into the bipolar-type, low-resistance region of FIG. 3.

The three-terminal device according to both of the above-described embodiments of the present invention can be realized both with discrete components, and, preferably, as a monolithic device integrated on a single silicon chip, using any known manufacturing process adopted for the fabrication of an IGD device. One suitable process has, for example, been described in the European Patent Application No. 93830255.1.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An insulated-gate power electronic device, comprising:

first and second external terminals;

an insulated-gate transistor having a first electrode, a second electrode having first and second terminals, and a control electrode;

a bipolar power transistor, forming a darlington pair with the insulated-gate transistor, and having;

a first electrode coupled to the first electrode of the insulated-gate transistor and to the first external terminal of the insulated-gate power electronic device;

a second electrode coupled to the second external terminal of the insulated-gate power electronic device; and a control electrode coupled to the first terminal of the second electrode of the insulated-gate transistor;

switching means, coupled between the control and second electrodes of the bipolar power transistor and operative in response to a control signal, for assuming a highly conductive state when the control signal is asserted and for assuming a non-conductive state when the control signal is de-asserted; and control means, coupled to the second terminal of the second electrode to receive a sense signal indicative of a current flowing between the first and second external terminals, for asserting the control signal in response to a low current value flowing between the first and second external terminals and for deasserting the control signal in response to a high current value flowing between the first and second external terminals.

2. The device of claim 1, wherein the control means includes means for de-asserting the control signal to switch the switching means from the highly conductive state to the non-conductive state in response to a voltage between the first and second external terminals exceeding a selected threshold.

3. The device of claim 2, wherein the selected threshold is equal to at least a base-emitter turn-on voltage of a bipolar transistor.

4. The device according to claim 2, wherein the first terminal of the second electrode of the insulated-gate transistor is coupled to a first plurality of elementary transistor cells and the second terminal of the second electrode is coupled to a second plurality of elementary transistor cells in the insulated-gate transistor.

5. The device according to claim 1, wherein the sense signal indicative of a current is a voltage, and the control means includes a comparator having a first input coupled to the second terminal of the second electrode of the insulated gate transistor to receive the sense signal, a second input receiving a reference threshold voltage, and an output coupled to the switching means to provide the control signal.

6. The device of claim 5, wherein the reference threshold voltage is equal to a base-emitter turn-on voltage of a bipolar transistor.

7. The device according to claim 5, wherein the switching means includes a transistor having first and second terminals respectively coupled to the control and second electrodes kof the bipolar power transistor, and a control electrode coupled to the first electrode of the transistor in the comparing means to receive the control signal.

8. The device according to claim 7, wherein the transistor in the switching means is a low-voltage N-channel MOSFET.

9. The device according to claim 1, wherein the control means includes a transistor having a control electrode coupled to the second electrode of the insulated-gate transistor to receive the sense signal, a first electrode coupled to the switching means to provide the control signal, and a second electrode coupled to the second external terminal.

10. The device according to claim 9, wherein the switching means includes a transistor having first and second terminals respectively coupled to the control and second electrodes of the bipolar power transistor, and a control electrode that receives the control signal.

11. The device according to claim 9, wherein the transistor in the control means is a low-voltage N-channel MOSFET.

12. The device according to claim 1, wherein the bipolar power transistor is of an NPN type.

13. The device according claim 12, wherein the insulated-gate transistor is a high-voltage N-channel MOSFET.

14. The device according to claim 1, wherein the device is integrated on a single silicon chip.

15. An insulated-gate power electronic device, comprising:

first and second external terminals;

an insulated-gate transistor, having a first electrode, a second electrode, and a control electrode that receives an input signal;

a bipolar power transistor, having;
   a first electrode coupled to the first electrode of the insulated-gate transistor and to the first external terminal of the insulated-gate power electronic device;
   a second electrode coupled to the second external terminal of the insulated-gate power electronic device; and
   a control electrode coupled to the second electrode of the insulated-gate transistor; and
a variable resistance circuit, having first and second terminals respectively coupled to the control and second electrodes of the bipolar power transistor, and having a control terminal that receives a control signal in response to one of a voltage across the first and second external terminals and a current flowing between the first and second external terminals, the variable resistance circuit changing its resistance in response to changes in the control signal.

16. An insulated-gate power electronic device, comprising:
   first and second external terminals;
   an insulated-gate transistor, having a first electrode, a second electrode, and a control electrode that receives an input signal;
   a bipolar power transistor, having;
      a first electrode coupled to the first electrode of the insulated-gate transistor and to the first external terminal of the insulated-gate power electronic device;
      a second electrode coupled to the second external terminal of the insulated-gate power electronic device; and
      a control electrode coupled to the second electrode of the insulated-gate transistor; and
   a variable resistance circuit, having first and second terminals respectively coupled to the control and second electrodes of the bipolar power transistor, and having a control terminal that receives a control signal, the variable resistance circuit changing its resistance in response to changes in the control signal;
   wherein the insulated-gate power electronic device includes a sensor having a sensor terminal that provides a sensing signal indicative of one of a voltage across the first and second external terminals and a current flowing between the first and second external terminals.

17. The device of claim 16, further comprising a control circuit, coupled to the sensor terminal and to the control terminal of the variable resistance circuit, the control circuit providing the control signal at a first level when the sensing signal is less than a selected threshold signal and at a second level when the sensing signal is greater than the selected threshold signal, and wherein the variable resistance circuit assumes respectively first and second resistances in response to the first and second levels of the control signal.

18. The device of claim 17, wherein the first resistance is substantially a short circuit and the second resistance is substantially an open circuit.

19. The device of claim 17, wherein the control circuit includes a comparator having a first input coupled to the sensing terminal, a second input that receives the selected threshold signal, and an output, coupled to the control terminal of the variable resistance circuit, that provides the control signal.

20. The device of claim 19, wherein the comparator further includes first and second power terminals respectively coupled to the control electrode of the insulated-gate transistor and the second electrode of the bipolar power transistor.

21. The device of claim 20, wherein the control circuit further includes a reference generator that generates the selected threshold signal.

22. The device of claim 21, wherein the reference generator has a first power terminal coupled to the control electrode of the insulated-gate transistor, a second power terminal coupled to the second terminal of the bipolar power transistor, and an output terminal coupled to the second input of the comparator.

23. The device of claim 17, wherein the control circuit includes a control transistor having first, second, and control terminals, the first terminal being coupled to the control terminal of the variable resistance circuit, the second terminal being coupled to the second electrode of the bipolar power transistor, and the control terminal being coupled to the sensor terminal.

24. The device of claim 23, wherein the control circuit further includes an impedance coupled between the first terminal of the control transistor and the control terminal of the insulated-gate transistor.

25. The device of claim 23, wherein the control transistor is an NPN bipolar transistor.

26. The device of claim 16, wherein the second electrode is a dual electrode having first and second terminals, and the second terminal of the second electrode is coupled to the sensor terminal.

27. The device of claim 26, wherein the first terminal of the second electrode of the insulated-gate transistor is coupled to a first source within the insulated-gate transistor that includes a first plurality of elementary transistor cells, and the second terminal of the second electrode of the insulated-gate transistor is coupled to a second source that includes a second plurality of elementary transistor cells within the insulated-gate transistor circuit.

28. An insulated-gate power electronic device, comprising:
   first and second external terminals;
   an insulated-gate transistor, having a first electrode, a second electrode, and a control electrode that receives an input signal;
   a bipolar power transistor, having;
      a first electrode coupled to the first electrode of the insulated-gate transistor and to the first external terminal of the insulated-gate power electronic device;
      a second electrode coupled to the second external terminal of the insulated-gate power electronic device; and
      a control electrode coupled to the second electrode of the insulated-gate transistor;
   a variable resistance circuit having first and second terminals respectively coupled to the control and second electrodes of the bipolar power transistor, and having a control terminal that receives a control signal, the variable resistance circuit changing its resistance in response to changes in the control signal; and
   a diode having an anode coupled to the control electrode of the bipolar power transistor and a cathode coupled to the control electrode of the insulated-gate transistor.

29. An insulated-gate power electronic device, comprising:
   first and second external terminals;
   an insulated-gate transistor, having a first electrode, a second electrode, and a control electrode that receives an input signal;

a bipolar power transistor, having;
  a first electrode coupled to the first electrode of the insulated-gate transistor and to the first external terminal of the insulated-gate power electronic device;
  a second electrode coupled to the second external terminal of the insulated-gate power electronic device; and
  a control electrode coupled to the second electrode of the insulated-gate transistor;
a variable resistance circuit, having first and second terminals respectively coupled to the control and second electrodes of the bipolar power transistor, and having a control terminal that receives a control signal, the variable resistance circuit changing its resistance in response to changes in the control signal; and
discharge means, coupled to the control electrode of the bipolar power transistor and the control electrode of the insulated-gate transistor, for reducing conduction of the bipolar power transistor in response to a decrease in voltage at the control electrode of the insulated-gate transistor.

30. An insulated-gate power electronic device, comprising:
first and second external terminals;
an insulated-gate transistor, having a first electrode, a second electrode, and a control electrode that receives an input signal;
a bipolar power transistor, having;
  a first electrode coupled to the first electrode of the insulated-gate transistor and to the first external terminal of the insulated-gate power electronic device;
  a second electrode coupled to the second external terminal of the insulated-gate power electronic device; and
  a control electrode coupled to the second electrode of the insulated-gate transistor; and
a variable resistance circuit, having first and second terminals respectively coupled to the control and second electrodes of the bipolar power transistor, and having a control terminal that receives a control signal, the variable resistance circuit changing its resistance in response to changes in the control signal;
wherein the variable resistance circuit includes a transistor having a first electrode coupled to the control electrode of the bipolar power transistor, a second electrode coupled to the second electrode of the bipolar power transistor, and a control electrode coupled to the control terminal of the variable resistance circuit; and
wherein the transistor in the variable resistance circuit is an N-type field effect transistor.

31. An insulated-gate power electronic device comprising:
first and second external terminals;
an insulated-gate transistor having a drain electrode, a first source electrode, and a gate electrode;
a bipolar power transistor, forming a darlington pair with the insulated-gate transistor, and further having;
  a collector electrode coupled to the drain electrode of the insulated-gate transistor and to the first external terminal of the insulated-gate power electronic device;
  an emitter electrode coupled to the second external terminal of the insulated-gate power electronic device; and
  a base electrode coupled to the first source electrode of the insulated-gate transistor;
a switch having first and second terminals respectively coupled to the base and emitter electrodes of the bipolar power transistor and having a control terminal that receives a control signal, the switch being varied between a substantially conductive state and a substantially non-conductive state in response to a variation in the control signal; and
a sensor coupled to the first external terminal that provides a sensing signal which varies in accordance with variations in one of a voltage across the first and second external terminals and a current that flows between the first and second external terminals.

32. The device of claim 31, further including:
a control circuit that receives the sensing signal and generates the control signal, the control circuit providing the control signal at a first level in response to the sensing signal being greater than a predetermined threshold and at a second level in response to the sensing signal being less than the predetermined threshold; and
wherein the switch respectively assumes the substantially non-conductive and substantially conductive states in response to the control signal being provided at the first and second levels.

33. The device of claim 32, wherein the control circuit includes a control transistor having first, second, and control terminals, the first terminal being coupled to the control terminal of the switch, the second terminal being coupled to the emitter electrode of the bipolar power transistor, and the control terminal being coupled to the sensor to receive the sensing signal.

34. The device of claim 33, further comprising an impedance coupled between the first terminal of the control transistor and the gate electrode of the insulated-gate transistor.

35. A power electronic circuit for supplying power to a load, comprising:
first and second insulated-gate power electronic devices coupled in series between first and second supply voltages and being coupled together at a common point that is coupled to the load;
the first insulated-gate power electronic device including a first external terminal coupled to the first supply voltage, a second external terminal coupled to the common point, and a third external terminal receiving a first input switching signal;
the second insulated-gate power electronic device including a first external terminal coupled to the common point, a second external terminal coupled to the second supply voltage, and a third external terminal receiving a second input switching signal; and
a control circuit that respectively provides the first and second input switching signals to the third external terminals of the first and second insulated-gate power electronic devices, to switch on the first and second insulated-gate power electronic devices one at a time to supply power to the load;
each of the first and second insulated-gate power electronic devices further including;
  an insulated-gate transistor having a first electrode, a dual second electrode having first and second terminals, and a control electrode coupled to the third external terminal of the respective insulated-gate power electronic device, the second terminal of the dual second electrode generating a control signal;

a bipolar power transistor, forming a darlington pair with the insulated-gate transistor, and having;

a first electrode coupled to the first electrode of the insulated-gate transistor and to the first external terminal of the respective insulated-gate power electronic device;

a second electrode coupled to the second external terminal of the respective insulated-gate power electronic device; and a control electrode coupled to the first terminal of the second electrode of the insulated-gate transistor; and switching means, coupled between the control and second electrodes of the bipolar power transistor and to the second terminal of the dual second electrode, operative in response to the control signal, for assuming a highly conductive state when the control signal is asserted and for assuming a substantially non-conductive state when the control signal is deasserted.

36. The power electronic circuit of claim 35, wherein, for each of the first and second insulated-gate power electronic devices, the second terminal of the dual electrode of the insulated-gate transistor provides a sense signal indicative of one of a current and a voltage between the first and second external terminals, and each of the first and second insulated-gate power electronic devices further includes control means for selectively asserting and deasserting the control signal, the control means including comparing means for comparing the sense signal with a selected threshold and for asserting the control signal when the sense signal exceeds the selected threshold.

37. The power electronic circuit of claim 36, wherein the selected threshold substantially equals a base-emitter turn-on voltage of a bipolar transistor.

38. The power electronic circuit according to claim 36, wherein the comparing means includes a comparator having a first input coupled to the second terminal of the second electrode of the insulated gate transistor to receive the sense signal, a second input receiving a reference signal indicative of the selected threshold, and an output coupled to the switching means to provide the control signal.

39. The power electronic circuit of claim 38, wherein the selected threshold is equal to a base-emitter turn-on voltage of a bipolar transistor.

40. The power electronic circuit according to claim 36, wherein the comparing means includes a transistor having a control electrode, coupled to the second electrode of the insulated-gate transistor, to receive the sense signal, a first electrode, coupled to the switching means, to provide the control signal, and a second electrode, coupled to the second external terminal, to establish the selected threshold at a voltage one base-emitter voltage drop higher than a voltage of the second external terminal.

41. The power electronic circuit according to claim 40, wherein the switching means includes a transistor having first and second terminals respectively coupled to the control and second electrodes of the bipolar power transistor, and a control electrode coupled to the first electrode of the transistor in the comparing means to receive the control signal.

42. The power electronic circuit according to claim 40, wherein the transistor in the control means is a low-voltage N-channel MOSFET.

43. The power electronic circuit according to claim 36, wherein the first terminal of the second electrode of the insulated-gate transistor is coupled to a first plurality of elementary transistor cells and the second terminal of the second electrode is coupled to a second plurality of elementary transistor cells in the insulated-gate transistor.

44. The power electronic circuit according to claim 35, wherein the switching means for each of the first and second insulated-gate power electronic devices includes a transistor having first and second terminals respectively coupled to the control and second electrodes of the bipolar power transistor, and a control electrode that receives the control signal.

45. The power electronic circuit according to claim 35, wherein each of the first and second insulated-gate power electronic devices is integrated on a single silicon chip.

46. A method for controlling an output resistance between first and second external terminals of an insulated-gate power electronic device, the insulated-gate power electronic device including an insulated-gate transistor and a bipolar power transistor having base and emitter terminals, the insulated-gate transistor and the bipolar power transistor being connected together in a darlington configuration, the method comprising the steps of:

A. determining whether one of a voltage and a current between the first and second external terminals falls below a predetermined threshold; and B. shunting the base and emitter terminals of the bipolar power transistor in response to a determination in step A that said one of the voltage and the current falls below the predetermined threshold.

47. The method of claim 46, wherein step B includes short-circuiting the base and emitter terminals of the bipolar power transistor.

48. The method of claim 46, wherein step B includes a step of varying a resistance of a variable-resistance device coupled between the base and emitter terminals of the bipolar power transistor.

49. The method of claim 48, wherein step A further includes the steps of:

generating a sense signal which varies in accordance with the variations in the voltage between the first and second external terminals; and comparing the sense signal to the predetermined threshold.

50. The method of claim 49, wherein step B further includes a step of activating the variable-resistance device to assume a conductive state in response to the sense signal being less than the predetermined threshold, so that the bipolar power transistor is disabled from conducting current.

51. The method of claim 49, wherein step B further includes a step of:

activating the variable-resistance device to assume a non-conductive state in response to the sense signal being greater than the predetermined threshold, so that the bipolar power transistor is not enabled to conduct current.

52. An insulated-gate power electronic device, comprising:

first and second external terminals;

an insulated-gate transistor having a first electrode, a second electrode, and a control electrode;

a bipolar power transistor, forming a darlington pair with the insulated-gate transistor, and having;

a first electrode coupled to the first electrode of the insulated-gate transistor and to the first external terminal of the insulated-gate power electronic device;

a second electrode coupled to the second external terminal of the insulated-gate power electronic device; and a control electrode coupled to the second electrode of the insulated-gate transistor; and switching means, coupled between the control and second electrodes of the bipolar power transistor, for assuming a highly conductive state when one of a voltage and a current between the first and second external terminals exceeds a predetermined value and for assuming a substantially non-conductive state when the one of a voltage and a current falls below the predetermined value.

53. The device of claim 52, further comprising a sensor coupled to the first external terminal that generates a sense signal indicative of the one of a voltage and a current between the first and second external terminals.

54. The device of claim 53, wherein the switching means includes:

a switch that assumes the conductive and non-conductive states in response to a control signal; and control means for selectively asserting and deasserting the control signal, the control means including comparing means for comparing the sense signal with a selected threshold and for asserting the control signal when the sense signal exceeds the selected threshold.

55. The device of claim 54, wherein the selected threshold substantially equals a base-emitter turn-on voltage of a bipolar transistor.

56. The device according to claim 54, wherein the comparing means includes a comparator having a first input coupled to the second terminal of the second electrode of the insulated gate transistor to receive the sense signal, a second input receiving a reference signal indicative of the selected threshold, and an output coupled to the switching means to provide the control signal.

* * * * *